United States Patent [19]

Asano et al.

[11] Patent Number: 4,933,708
[45] Date of Patent: Jun. 12, 1990

[54] IMAGE RECORDING APPARATUS USING MICROCAPSULES TO FORM A COLOR IMAGE

[75] Inventors: Yuji Asano; Isao Kawano, both of Nagoya, Japan

[73] Assignee: Brother Kogyo Kabushiki Kaisha, Japan

[21] Appl. No.: 177,698

[22] Filed: Apr. 5, 1988

[30] Foreign Application Priority Data

Apr. 6, 1987 [JP] Japan .................................. 62-84453
Jan. 12, 1988 [JP] Japan .................................. 63-3974

[51] Int. Cl.⁵ .......................................... G03G 15/01
[52] U.S. Cl. .......................................... 355/32; 355/27; 355/326; 430/138
[58] Field of Search .................... 430/138; 355/27, 32, 355/100, 4

[56] References Cited

U.S. PATENT DOCUMENTS

| | | | |
|---|---|---|---|
| 3,386,822 | 6/1968 | Brynko | 430/138 |
| 4,624,560 | 11/1986 | Beery | 430/138 X |
| 4,647,182 | 3/1987 | Pierce | 355/32 X |
| 4,742,374 | 5/1988 | Yamamoto et al. | 430/138 X |
| 4,772,922 | 9/1988 | Kawahara et al. | 355/32 |
| 4,810,614 | 3/1989 | Sangyoji et al. | 430/138 |
| 4,825,256 | 4/1989 | Nakai et al. | 430/138 X |

Primary Examiner—A. T. Grimley
Assistant Examiner—Robert Beatty
Attorney, Agent, or Firm—Oliff & Berridge

[57] ABSTRACT

An image recording apparatus which eliminates a positive film for carrying photomasks. The apparatus for recording an image on a recording medium uses a recording media including first and second recording mediums. The first recording medium has first and second surfaces and is provided with a first material whose phase is changeable upon light exposure, and the second recording medium is provided with a second material reactable with the first material for forming a final output image thereon. The image recording apparatus forms light-shieldable masks on the first surface of the first recording medium. A light exposure arrangement confronts the first surface of the first recording medium for irradiating light toward the mask and the first surface. A pressure-developing arrangement provides the output image on the second recording medium. The second surface of the first recording medium carries the first material, and the second material of the second recording medium confronts the second surface of the first recording medium at the pressure-developing means.

1 Claim, 4 Drawing Sheets

IMAGE RECORDING APPARATUS USING MICROCAPSULES TO FORM A COLOR IMAGE

BACKGROUND OF THE INVENTION

The present invention relates to an image recording apparatus, and more particularly, to such apparatus for recording a color image.

According to an image recording apparatus of this kind, a photosensitive image recording medium is used which carries a plurality of microcapsules encapsulating therein chromogenic material. Further, a positive film or mask is formed by a monochrome thermal transfer machine and the photosensitive image recording medium is light exposed through the positive film. Such a technique is disclosed in Japanese Patent Application laid open Publication No. 61-143739.

In such image recording apparatus, the positive mask is provided in a film sheet web which is not a final output image carrying member, but an article of consumption. Further, a conveyor mechanism is required to transfer such positive film. Therefore, the resultant apparatus becomes bulky and costly.

SUMMARY OF THE INVENTION

It is therefore, an object of the present invention to overcome the above described drawbacks and to provide an improved image recording apparatus.

Another object of this invention is to provide such an apparatus capable of eliminating a positive film.

Still another object of this invention is to provide an image recording apparatus in which different kinds of masks, each corresponding to color informations different from one another, can be set at a controlled position, while at the same time, each one of the masks can be set on a corresponding one of contiguous filtering means, and the mask members are movable together with the filtering means.

In accordance with this invention there is provided an image recording apparatus for recording an image on recording medium, the recording medium including a first and second recording media, the first recording medium having first and second surfaces and provided with a first material whose phase is changeable upon light exposure. The second recording medium is provided with a second material reactable with the first material for forming a final output image thereon. The recording apparatus comprises a mask forming means for forming light shieldable masks on the first surface of the first recording medium, a light exposure means confronting the first surface of the first recording medium for irradiating light toward the mask and the first surface, and a pressure-developing means for providing the output image on the second recording medium. The second surface of the first recording medium carries the first material with the second material of the second recording medium confronting the second surface of the first recording medium at the pressure-developing means.

In another aspect of this invention, an image recording apparatus for recording an image on a recording medium according to this invention comprises a mask forming means for forming a plurality of masks each corresponding to color informations a light exposure unit for irradiating light toward the mask and the recording medium, a pressure-developing means for providing an output image on the recording medium and a mask position adjusting means for adjusting mask position in alignment with the light exposure unit. The mask position adjusting means is provided with a plurality of filtering functions which allow light having specific wavelengths to pass therethrough.

DETAILED DESCRIPTION OF THE PREFERRED EMBODIMENTS

Figure 1:
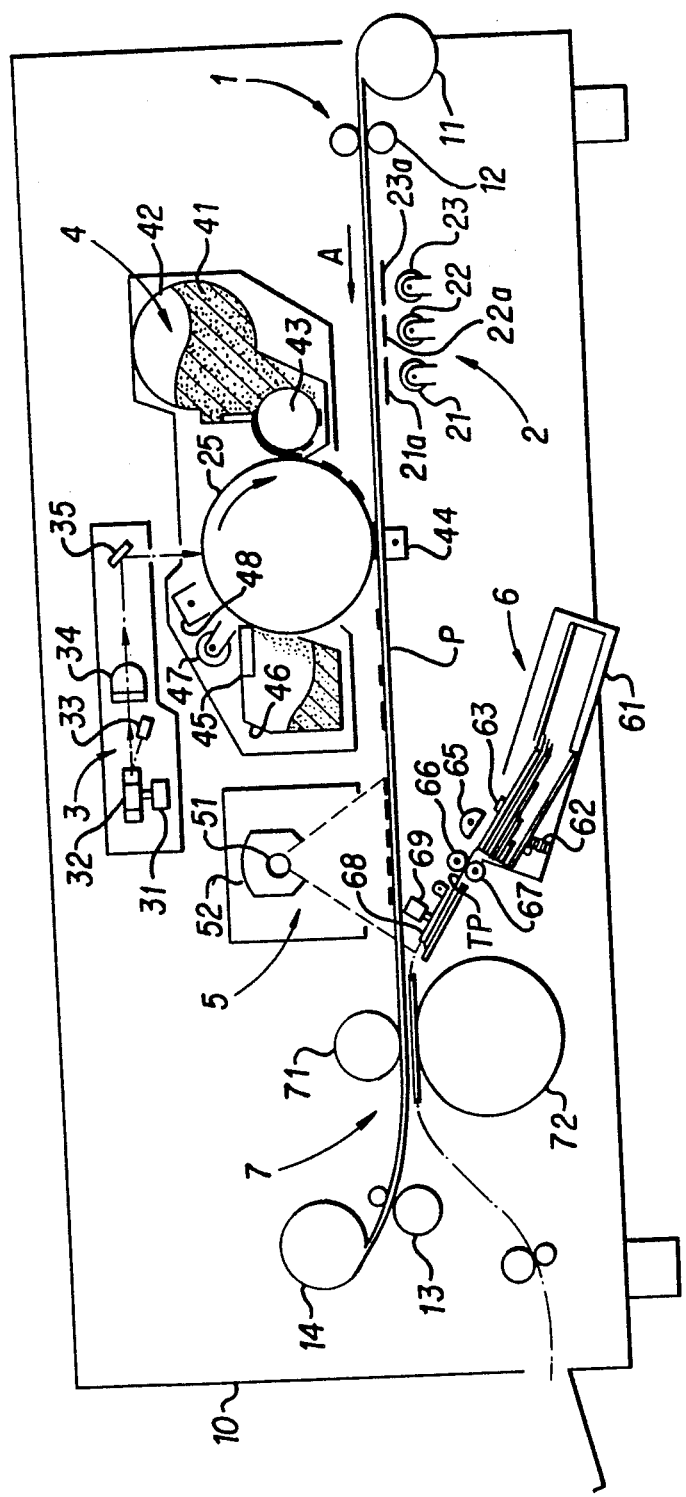
FIG. 1 is a schematic view showing multi-color image printing apparatus according to a first embodiment of this invention.
Figure 2:
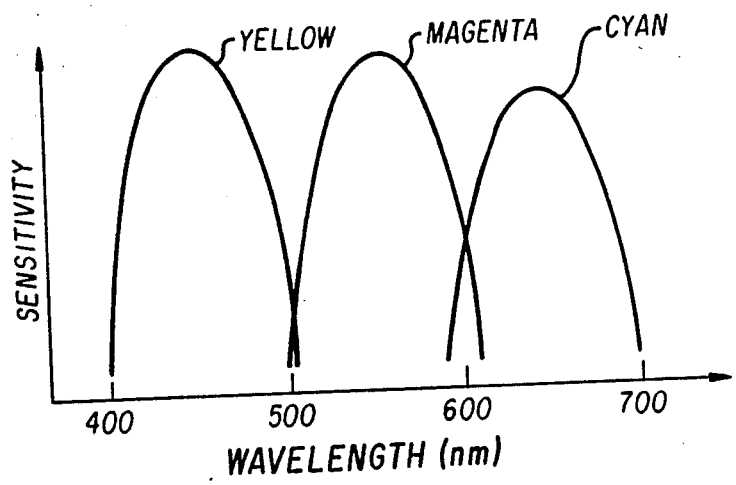
FIG. 2 is a graph showing spectroscopic sensitivities of microcapsules carried on a photosensitive/pressure sensitive image recording medium used in this embodiment.
Figure 3:
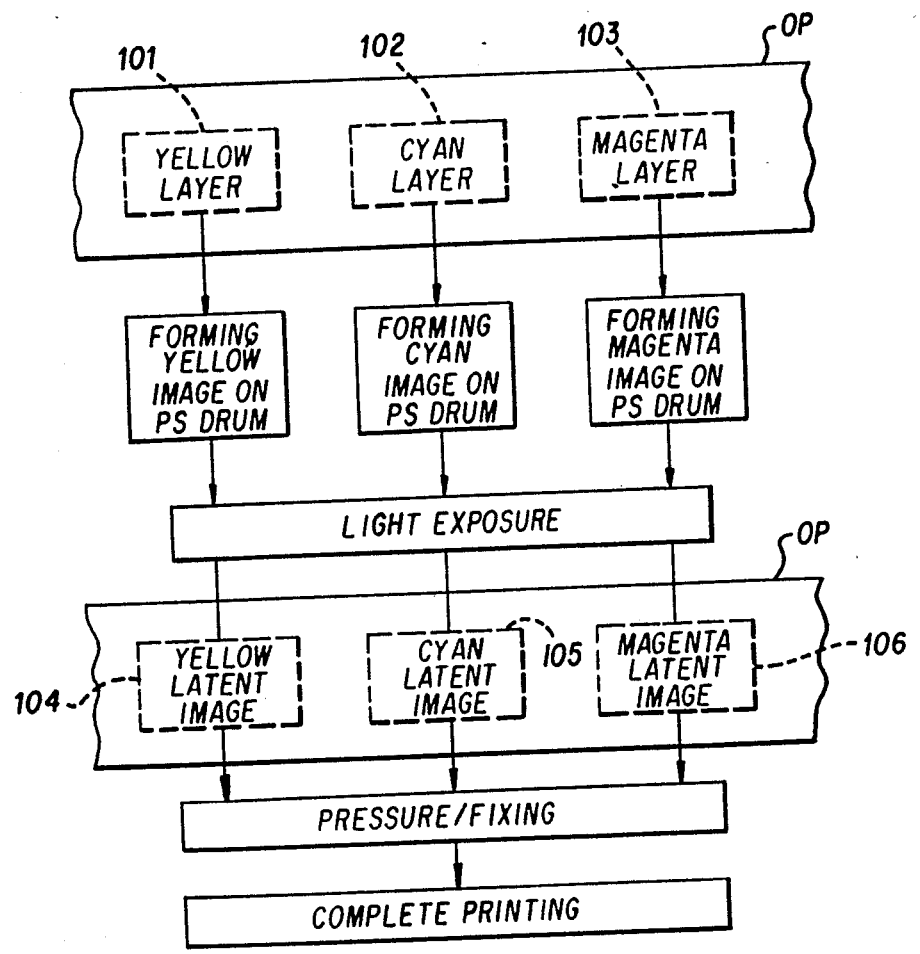
FIG. 3 is an explanatory diagram showing a printing process of the multi-color printing in the first embodiment.

A first embodiment of this invention will be described with reference to FIGS. 1 thru 3. The first embodiment concerns a multi-color printing apparatus. As best shown in FIG. 1, the multi-color printing apparatus includes a transfer unit 1 for transferring a photosensitive/pressure sensitive image recording medium P, a trichromatic light exposure unit 2 disposed below the transfer unit 1, a laser scanner unit 3 disposed above the transfer unit 1, a xerography unit 4 disposed adjacent the laser scanner unit 3 and above the transfer unit 1, a light exposure unit 5 disposed above the transfer unit 1 and at a downstream side of the xerography unit 4, image-transfer sheet supply unit 6 disposed below the transfer unit 1 and a pressure/image fixing unit 7.

The transfer unit 1 is adapted to transfer a web like photosensitive/pressure sensitive recording medium P and includes a sheet accommodating portion 11 in which a sheet roll is stored, transferring rollers 12 and 13 for transferring the web like sheet P, and a take-up portion 14 for winding the transferred web-like sheet P drawn out from the sheet accommodating portion 11. The photosensitive/pressure sensitive recording medium P carries at its surface microcapsules encapsulating therein chromogenic materials (dye precursor or color former) which are reacted with a developer material in an image transfer sheet TP (developer sheet) so as to form basic color components such as cyan, magenta and yellow. The image transfer sheet TP will be described later. The spectrosensitivity of the photosensitive/pressure sensitive recording medium P has a cyan peak sensitivity at a wavelength =650 nm, a magenta peak sensitivity at a wavelength =550 nm, and a yellow peak sensitivity at a wavelength =450 nm.

In the trichromatic light exposure unit 2, there are provided three halogen lamps 21, 22 and 23 which emit white light, and a red color filter 21a, a green color filter 22a and a blue color filter 23a, those filters being positioned between the halogen lamps and the sensitive recording medium P. With this structure red, green and blue lights are independently irradiated onto the sensitive recording medium P. The lights has peak values of 450 nm (blue), 550 nm (green) and 650 nm (red) corresponding to the spectro-sensitivities of the sensitive recording medium P.

The laser scanner unit 3 is adapted to form an electrostatic latent image on a photosensitive drum 25, described later in accordance with an image information. The unit 3 includes a motor 31, a polygonal mirror 32 rotatable by the motor 31, a semi-conductor laser 33 for irradiating a laser beam to the polygonal mirror 32, a fθ lens 34, and a flat mirror 35. The laser beam is reflected from the polygonal mirror 32 and directed toward the flat mirror 35 through the fθ lens 34. The beam is then reflected from the flat mirror 35 toward the photosensitive drum 25 of the xerography unit 4. Incidentially, the laser scanner unit 3 includes a controller unit (not shown) for converting digital image data on a basis of the image information into an optical signal. High speed scanning is carried out with respect to the surface of the photosensitive drum 25. Such a technique is well known in the laser printing art, and therefore, further description will be omitted for simplicity.

The xerography unit 4 is adapted to form a light shielding material over the latent image formed at the surface of the photosensitive drum 25. The xerography unit 4 includes the photosensitive drum 25 as a photosensitive member, a toner 41 as the light shielding material, a toner case 42 for accommodating the toner 41, a developing sleeve 43 for adhering the toner 41 onto the surface of the drum 25, a transfer corotron 44 for transferring a toner image from the drum 25 to the sensitive recording medium P, a cleaning or scraper member 45 for removing residual toner 41 from the drum 25 after the toner image transfer, a toner collecting casing 46 for collecting the residual toners, an erase lamp 47 for removing residual charge on the photosensitive drum 25, and a charge corotron 48 for uniformly charging the entire surface of the photosensitive drum 25.

After the photosensitive drum 25 is uniformly charge by the charging corotron 48, the drum 25 is subjected to laser beam exposure at an area corresponding to the imaging portion by the laser scanner unit 3, so that electrostatic latent image is provided at the surface of the drum 25. In the toner case 42, a single component black toner 41 is accummulated. The toner 41 is uniformly carried over an outer peripheral surface of the developing sleeve 43 and is transferred onto the surface of the drum 25 at an area corresponding to the latent image so that the toner image is provided at the drum 25. In this case, the toner 41 has the same polarity as that of the non-exposed latent image portion. Therefore, the toner adheres to the exposed portion of drum by the electrostatic force. Almost all the toner image formed on the drum 25 is transferred to the sensitive recording medium P, at the portion in contact therewith, and is removed from the drum 25. However, residual toner remains on the drum surface. The residual toner is scraped from the drum surface by the cleaning member 45 connected at the collecting casing 46. Thereafter, the photosensitive drum 25 is irradiated by the erase lamp 47 so as to diminish residual charge. Upon completion of a single rotation of the drum 25, the drum 25 is again uniformly charged by the charging corotron 48 for subsequent latent image and toner image formations.

The light exposure unit 5 exposes the sensitive recording medium P carrying the toner image from the xerography unit 4, to light. The light exposure unit 5 includes an exposure lamp 51, such as a halogen lamp, and a reflector 52 for concentrating a light oriented toward the sensitive recording medium P.

The image-transfer sheet supply unit 6 is adapted to supply the image-transfer sheet TP toward the pressure/image fixing unit 7. The image-transfer sheet TP has the developer material at a surface layer thereof. The developer material reacts with the chromogenic material in the microcapsules of the photosensitive/pressure sensitive recording medium P upon rupture of the microcapsules so that the above-described basic colors are provided at the image transfer sheet. The supply unit 6 includes a sheet cassette 61 for stacking cut transfer sheets TP, a biasing means such as a coil spring 62 for biasing the sheets TP upwardly, a stop guide 63 for preventing the sheet stack TP from excessive upward displacement, a sheet feed roller 65 for supplying a single image-transfer sheet TP from the sheet cassette 61, a pair of transporting rollers 66,67 for transporting the single image-tansfer sheet TP, a resist gate 68 for adjusting the position of leading end of the single sheet TP, and a solenoid 69 for selectively opening and closing the resist gate 68. When the resist gate 68 is opened by the actuation of the solenoid 68, a single image-transfer sheet TP is supplied to the pressure/image fixing unit 7.

The pressure/image fixing unit 7 is adapted to apply pressure to the sensitive recording medium P which has been light exposed at the light exposure unit 5 and the image transfer sheet TP in facial contact with the sensitive recording medium P. The unit 7 includes a pair of pressure rollers 71 and 72 for interposing the sheets P and TP therebetween. Upon pressure application, the microcapsules which have not been light-exposed by the shielding function of the toner image are ruptured, so that the chromogenic material flows and reacts with the developer material of the image transfer sheet TP.

Multi-color printing process in accordance with the first embodiment will next be described.

The photosensitive/pressure sensitive recording medium P drawn out of the sheet accommodating portion 11 is moved in the direction indicated by arrow A, by the sheet transfer unit 1, and travels over to the trichromatic light exposure unit 2. When the sensitive recording medium P passes over the red color filter 21a, the halogen lamps 21 and 22 are lighted for providing red and green lights. As a result, first and second microcapsules which encapsulate first and second chromogenic materials are photo-cured. That is, the microcapsules encapsulating cyanic color forming chromogenic material and magenta color forming chromogenic material respectively are photo-cured. Then, after the sensitive recording medium P is travelled by a predetermined length, the halogen lamps 22 and 23 are lighted so that green and blue lights are provided through the green and blue filters 22a and 23a. As a result, the second and third microcapsules encapsulating second and third chromogenic materials are photo-cured. That is, the microcapsules encapsulating the magenta color forming chromogenic material and yellow color forming chromogenic material respectively are photo-cured. Thereafter, the sensitive recording medium P is again moved a predetermined length, and the halogen lamps 23 and 21 are lighted so that blue and red lights are provided through the blue and red filters 23a and 21a. As a result, the third and the first microcapsules are photo-cured. That is, the microcapsules encapsulating the yellow color forming chromogenic material and cyanic color forming chromogenic material respectively are photo-cured. Accordingly, as shown in FIG. 3, provided successively are a yellow color zone 101 at which only the microcapsules encapsulating the yellow color forming chromogenic material are not photo-cured, a cyan color zone 102 at which only the microcapsules encapsulating the cyanic color forming chromogenic material are not photo-cured, and a magenta color zone at which only the microcapsules encapsulating the magenta color forming chromogenic material are not photo-cured.

Then the laser scanner unit 3 and the xerography unit 4 are operated for forming toner images on the surface of the photosensitive drum 25 in such a manner that the left side of the images is reversed to right side and vice versa with respect to the yellow, cyan and magenta colors.

Thus formed toner images are transferred to the sensitive recording medium P by the transfer coroton 44. That is, the left-right inversed toner image on the drum surface for the yellow portion is transferred to a back surface of the sensitive recording medium portion which covers the yellow zone 101, the left-right inversed toner image on the drum surface for the cyan portion is transferred to a back surface of the sensitive recording medium portion which covers the cyan zone 102, and the left-right inversed toner image on the drum surface for the magenta portion is transferred to a back surface of the sensitive recording medium portion which covers the magenta zone 103.

The sensitive recording medium P is moved further and exposed to light at the exposure unit 5. That is, the back surface of the sensitive recording medium P is irradiated by the exposure lamp 51, so that each of the zones of the sensitive recording medium turns into positive mask for yellow, cyan and magenta, to thus provide yellow latent image 104, cyan latent image 105 and magenta latent image 106.

Thereafter, the sensitive recording medium P is moved further to the vicinity of the pressure/image fixing roller 7. In this instance, the image transfer sheet TP is supplied from the sheet supply unit 6, and firstly, the image transfer sheet TP is in pressure contact with the yellow zone 101 of the sensitive recording medium P. After the pressure contact, the sensitive recording medium P is moved by a given distance, and the cyan zone 102 is brought into pressure contact with the image transfer sheet TP. The same is true with respect to the magenta zone 103. As a result of the pressure contacts, non-photo cured microcapsules in the yellow, cyan and magenta zones are ruptured, so that chromogenic materials in the microcapsules are reacted with the developer material of the image transfer sheet TP.

As described above, according to the first embodiment of this invention, light shieldable toner images are formed at the back surface of the corresponding color formable zones of the photosensitive/pressure sensitive recording medium P for the multi-color printing. Therefore, the first embodiment can dispense with a positive film which has been conventionally required for color printing. As a result, expendables can be minimized thereby producing an economical color printing apparatus. More specifically, at least three positive films have been conventionally required for multi-color printing. However, such plurality of independent masks can be eliminated in the first embodiment. Further, it is unnecessary to provide a feed mechanism for feeding the positive film so that a compact apparatus results.

The image forming apparatus described above can be applied to the monochrome image forming apparatus. Further, the apparatus is also available for a copying machine in which the above described laser scanner unit 3 is replaced by another type of an optical scanning unit. Furthermore, instead of the laser scanner 3, a LED array, a florescent lamp, and a liquid crystal array can be employed. In another modification, instead of the use of the toner 41 at the xerography unit 4, a thermal transfer type printer may be used for forming light-shielding image.

Second and third embodiments according to this invention will be described.

Generally, in an image recording apparatus, there are two kinds of light exposure methods for obtaining an image by irradiating light onto a photosensitive/pressure sensitive image recording medium. That is, (a) the sensitive image recording medium is exposed with light which has transmitted through an original, and (b) the sensitive medium is exposed with reflection light reflected from the original.

For recording a color image using such image recording apparatus, several color image informations are derived from a single color original, and a plurality of masks are formed having masking images different from one another corresponding to the respective color image information derived from the original. Then, the sensitive recording medium undergoes several light exposures, each exposure overlapping one of the masks with the sensitive medium. Here, in case of the method (a), the masks are formed of light-shieldable material, whereas in case of the method (b), the masks are formed of non-light reflective material. When each of the masks is successively moved to a light exposure station, the mask is subjected to position adjustment. The sensitive recording medium includes several kinds of color generating agents which are reacted, upon irradiation of light having specific wavelengths, with one another. In this case, the sensitive recording medium must be subjected to exposures of light having different wavelengths so as to provide different color images corresponding to the kinds of the masks. In order to irradiate the sensitive recording medium with different light, the following methods may be used:

(1) A plurality of light sources each generating light having a wavelength different from all others, each light source selectively lighted in accordance with the mask;

(2) a single light source used with a plurality of filters. Each of the filters allows light having a specific wavelength to pass therethrough, each of the filters selectively used in accordance with the mask;

The second and third embodiments concern method (2) yet provide great advantages thereover.

Figure 4:
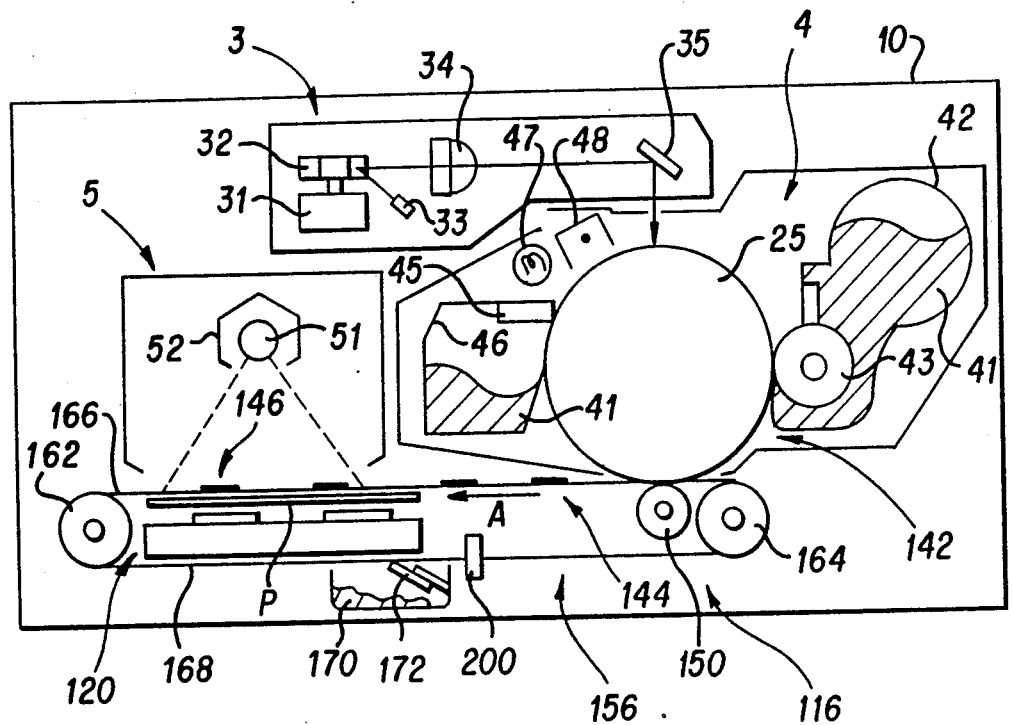
FIG. 4 is a schematic front view partially cross-sectioned showing an image recording apparatus according to a second embodiment of this invention.

In an image recording apparatus of the second embodiment, shown in FIG. 4, there is provided a box-shaped frame 10 containing a laser scanner unit 3, a xerography unit 4, a mask position adjusting unit 116, a light exposure unit 5, and an image recording sheet supply unit 120. The laser scanner unit 3 has the same construction as that of the first embodiment. Therefore, further description will be omitted.

In the xerography unit 4, a photosensitive drum 25 is provided whose spectroscopic sensitivity is greatly sensitized to the near-infrared ray region such as around 800 nm. The drum 25, shown in FIG. 4, is rotatable about its axis in clockwise direction. A charger corotron 48 is disposed at a rotationally retarded side with respect to the light impinging point on the drum 25 from the flat mirror 35. Therefore, the photosensitive drum 25 is uniformly charged by the corotron 48 and then the drum 25 is subjected to impingement of the laser beam reflected at the flat mirror 35. By the application of the laser beam, an electrostatic latent image is formed at the surface of the photosensitive drum 25. In the laser scanner unit 3, there is provided a controller unit (not shown) which converts digital image data in accordance with the character or picture information into an optical signal. The photosensitive drum 25 is subjected to high speed scanning for forming the latent image thereon in accordance with the image data (in the second embodiment, the latent image corresponds to the imaging portion). Such a technique is well known in the art and has been employed in an optical system of the commercially available laser printer. Therefore, further description is unnecessary.

Upon rotation of the photosensitive drum 25 at constant velocity, the latent image is formed thereon by the laser beam. At a rotationally advanced position with respect to the latent image forming position, there is provided a toner case 42 in which light shielding material such as black toner 41 is accommodated. In the toner case 42, a developing sleeve 43 extends in a direction parallel with the axial direction of the photosensitive drum 25. The developing sleeve 43 is rotatable about its axis in a counterclockwise direction. The developing sleeve 43 is in rotational contact with the photosensitive drum 25 for supplying toners toner 41 from the toner case 42 to the surface of the photosensitive drum 25. The toner 41 is charged to have the polarity the same as that of the unexposed area of the photosensitive drum 25. Accordingly, the toner 41 adheres to the drum surface portions which are light exposed and have polarity opposite to that of the unexposed area. That is, a positive mask 142 is formed at the drum surface. The mask provides an image the same as the image to be recorded. According to the image recording apparatus in the second embodiment, the color original image is recorded by multiplexing three basic color groups such as cyan, magenta and yellow color groups. Therefore, correspondingly three masks 142, 144 and 146 are formed with respect to a single color original image.

Immediately below the photosensitive drum 25, a transfer roller 150 is rotatably provided. The transfer roller 150 extends in a direction parallel with the axial direction of the drum 25. The photosensitive drum 25 and the transfer roller 150 interpose a moving file 156 (described later) therebetween for transferring the toner image on the drum 25 onto the moving film 156. The transfer roller 150 has applied thereto a high voltage having polarity opposite to that of the toner 41. Further, a toner collecting case 46 is provided at a position opposite the toner case 42 with respect to the photosensitive drum 25. In the toner collecting case 46, a toner scraping member 45 in contact with the drum is provided for removing the toner. After the photomasks 142, 144 and 146 are transferred from the drum 25 to the moving film 156, residual toner on the drum is scraped off by the scraper member 45 and collected in the collecting case 46. Further an erase lamp 47 is provided at a position between the toner collecting case 46 and the charger corotron 48 for diminishing residual charge on the photosensitive drum 25.

Below the photosensitive drum 25, the mask position adjusting unit 116 is provided. The adjusting unit 116 is adapted for moving the moving film 156 carrying thereon the photomasks 142, 144 and 146, and for adjusting the position of the photomasks. The moving film 156 is made of polyethylene terephthalate and has flexibility and light transmissive character. The moving film 156 has a thickness of about 70 to 200 μm, and has a width larger than that of the photosensitive/pressure sensitive recording medium P. The moving film 156 is in the form of an endless belt which is trained over a drive roller 162 and a driven roller 164. These drive and driven rollers 162 and 164 have their axes extending parallel with the axial direction of the photosensitive drum 25. By rotating the drive roller 162 by means of a drive motor (not shown), the moving film 156 is moved in a direction indicated by an arrow A.

Between the drive and driven rollers 162 and 164, an upper travel portion 166 and a lower travel portion 168 are defined. The upper travel portion 166 has a longitudinal length capable of receiving the three kinds of photomasks to be transferred from the photosensitive drum 25. Further, one end portion of the upper travel portion 166 is located at a position adjacent and below the drum 25 at which the toner image transfer is carried out. In other words, the above-mentioned transfer roller 150 is positioned immediately below the upper travel portion 166 so as to urge the upper travel portion 166 toward the photosensitive drum 25, so that the photomasks 142, 144 and 146 formed on the drum 25 are transferred to the upper travel portion 166 of the moving film 156. Most importantly, according to the second embodiment, the moving film 156 per se serves as a mask supporting member.

Below a longitudinally center portion of the lower travel portion 168 of the moving film 156, a toner collecting case 170 is provided. In the case 170, a cleaning blade 172 is provided for removing the masks 142, 144 and 146 from the moving film 156. The cleaning blade 172 obliquely extends in a direction opposite the running direction of the moving film 156 at the lower travel portion 168, and is in abutment therewith.

A light exposure unit 5 is disposed above the upper travel portion 166 and spaced away from the photosensitive drum 25. Each of the masks 142, 144 and 146 is successively brought into the exposure unit 5 with a fine positional adjustment. The light exposure unit 5 inlcudes a light source 51 and a light reflector 52 for concentrating the light toward the moving film 156. The light source 51 provides wide wave length bandwidth ranging from blue to red color. A fluorescent or halogen lamp may be available as the light source.

Figure 5:
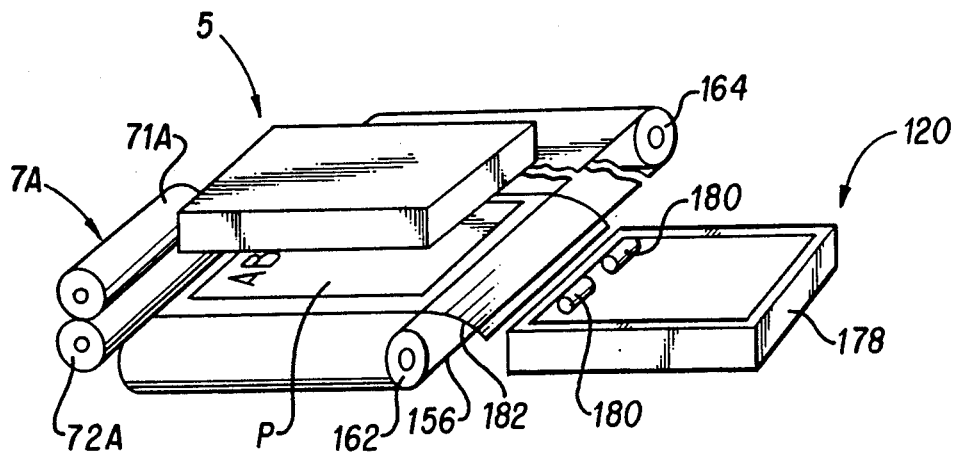
FIG. 5 is a perspective view showing a photosensitive/ pressure sensitive image recording medium supply unit and an image developing unit.

The photosensitive/pressure sensitive image recording medium supply unit 120 is provided at one side of the light exposed portion of the moving film 156. That is, the sheet supply unit 120 is positioned at one side of the mask position adjusting portion for the light exposure. The photosensitive/pressure sensitive image recording medium P is adapted to record and provide a final color output image. The recording medium P is in the form of a cut sheet as shown in FIG. 5 on which three kinds of microcapsules C, M and Y are carried. These microcapsules C, M and Y are photo-cured by the irradiations of lights having wavelengths of about 650 nm, about 550 nm and about 450 nm, respectively. Further, the microcapsules C, M and Y encapsultate therein photosensitive resin and photo polymerization initiator and chromogenic materials. Regarding the chromogenic materials, the microcapsule C encapsulates a chromatic pigment which generates cyan color, the microcapsule M encapsulates a chromatic pigment which generates magenta color, and the microcapsule Y encapsulates a chromatic pigment which generates yellow color. The photosensitive/pressure sensitive image recording medium is coated with a developer material which is reacted with the chromogenic materials for generating color image. That is, the image recording medium P is of a self-contained type image recording medium as disclosed in U.S. Pat. 4,440,846.

As best shown in FIG. 5, the image recording mediums P are stacked in a case 178. The medium P is supplied one by one by a pair of sheet feed rollers 180. A guide plate 182 extends transversely with respect to the moving film 156. The guide plate 182 is disposed between the upper and lower travel portions 166 and 168. One end of the guide plate 182 is positioned adjacent to a sheet discharge end of the case 178, while another end of the guide plate 182 is positioned adjacent to a pressure/image fixing unit 7A disposed at a position opposite the case 178 with respect to the moving film 156. The image fixing unit 7A includes a pair of pressure rollers 71A and 72A whose axes are parallel to the running direction of the moving film 156.

After a single recording medium sheet P is supplied from the case 178 by the sheet feed rollers 180, the recording medium sheet P is moved into a space defined between the upper travel portion 166 and the guide plate 182. The travel of the sheet P is suspended immediately below the light exposure unit 5. The recording medium cut sheet P is brought into soft pressure contact with the lower surface of the upper travel portion 166 of the movable film 156 by means of the pressure plate (not shown). Then, the recording medium sheet P is irradiated by the light transmitted through the movable film 156. Thereafter, the recording medium sheet P is moved toward the pressure/image fixing unit 7A guided by the guide plate 182 for providing a color image by of the reaction between the chromogenic materials and the developer materials upon rupture of the microcapsules C, M and Y.

Figure 6:
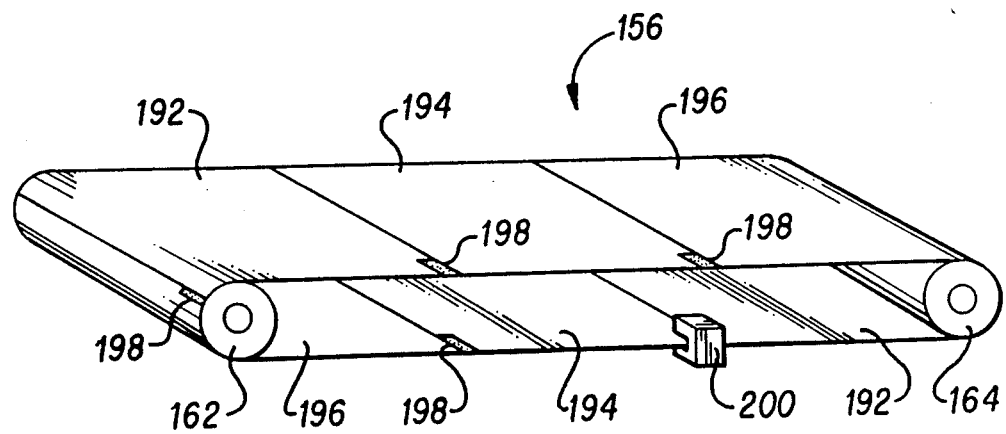
FIG. 6 is a perspective view showing a movable film used in the second embodiment; and, FIG. 7 is a schematic view showing an image recording apparatus according to a third embodiment of this invention.

As shown in FIG. 6, the endless movable film 156 is divided into six regions, equi-distance to one another, along the longitudinal direction thereof for successively providing red, green and blue coloring zones. Thus there are two red zones 192, two green zones 194 and two blue zones 196. As described above, the xerography unit 4 forms three kinds of masks 142, 144 and 146 on the photosensitive drum 25. These mask formations are caried out synchronous with the travel of the movable film 156 so as to respectively permit cyan group mask, magenta group mask and yellow group mask to be transferred to red zone 192, green zone 194 and blue zone 196 of the movable film 156.

At the boundaries between the neighboring zones, boundary marks 198 are provided which are formed of light shieldable material as shown in FIG. 6. Further, a sensor 200 is provided at the frame 10 for detecting the boundary mark 198. The sensor 200 is positioned in order to detect the boundary mark 198 when one of the zones 192, 194 and 196 is brought into the light exposure position. The sensor 200 may be a photoelectric sensor having light emitting and light receiving portions. When the light shieldable boundary mark 198 is entered into a space between the light emitting and receiving portions, the boundary mark 198 blocks the light transmittal so that the sensor 200 detects the mark 198. Upon detection of the boundary mark 198 by the sensor 200, the movement of the movable film 156 is stopped and one of the six regions of the movable film 156 carrying the mask thereon undergoes position adjustment at the exposure position. In a preferred embodiment the above-described boundary marks 198, the sensor 200, the movable film 156, the drive roller 162, and the drive motor for driving the roller 162 constitute the mask position adjusting unit or positioning means 116.

With the arrangement thus constructed, the photosensitive/pressure sensitive recording medium P is successively formed with cyan color group latent image, magenta color group latent image and yellow color group latent image at the exposure position. To attain this, firstly, the mask 146 of the cyan color group is formed at the xerography unit, and the mask is transferred to the red color zone 192 of the movable film 156. Next, the mask 144 of the magenta color group is formed at the xerography unit and the mask is transferred to the green color zone 194 of the movable film 156. When the mask 146 for the cyan color group reaches the exposure position, transfer of the mask 144 from the drum 25 to the green color zone 194 is completed. At the same time, the movement of the movable film 156 is stopped.

Then, light from the light source 51 is irradiated so that the photosensitive/pressure sensitive recording medium P is light-exposed through the movable film 156. In this case, since the red zone 192 carries the mask 146, only the specific light having wavelength of about 650 nm is transmitted through the non-masking portion of the red zone 192 for light exposing the sensitive recording medium P. Accordingly, the microcapsules C carried on the recording medium portion which corresponds to the nonmasking portion of the red zone 192 are photo-cured, whereas remaining microcapsules C positioned below the masking portion, and microcapsules M and Y are not photo-cured. As a result, the remaining microcapsules can be ruptured at the pressure unit 7A, to thereby obtain final cyan color image after three times light exposure with using the masks 144 and 142. Importantly, the movable film 156 serves as a filter for allowing specific light to pass therethrough and for blocking the transmittance of the other specific light in order to provide an output image corresponding to the mask image.

Upon completion of the light exposure toward the red zone 192 through the mask portion 146, the movable film 156 is moved, so that the green zone 194 is brought into the exposure position. In this case, since the green zone 194 carries the mask 144, only the specific light having wavelength of about 550 nm is transmitted through the non-masking portion of the green zone 194 for light exposing the sensitive recording medium P. Accordingly, microcapsules M carried on the recording medium portion which corresponds to the masking portion of the green zone 194 are not photo-cured. As a result, at the pressure unit 7A, such microcapsules M are ruptured to provide magenta color output image. The same is true with respect to the yellow output image. That is, since the blue zone 196 carries the mask 142, only the specific light having wavelength of about 450 nm is transmitted through the non-masking portion of the blue zone 196 for light exposing the sensitive recording medium P. Accordingly, microcapsules Y carried on the recording medium portion which corresponds to the masking portion of the blue zone 196 are not photo-cured. As a result, at the pressure unit 7A, such microcapsules Y are ruptured to provide yellow color output image.

In view of the foregoing, according to the second embodiment of this invention, the movable film 156 provided with three colorings functions as a filter. Therefore, travel of the masks 142, 144, 146 and their positional adjustments at the exposure position can be made concurrently with the movement and positional adjustment of the filtering member. Accordingly, in the second embodiment, it is unnecessary to provide a switching mechanism for selectively supplying one of the independent filters, to thereby provide a simplified mechanism at low cost. Further, in the second embodiment, since the movable film 156 serves as the mask supporting member, overall cost can be reduced.

Figure 7:
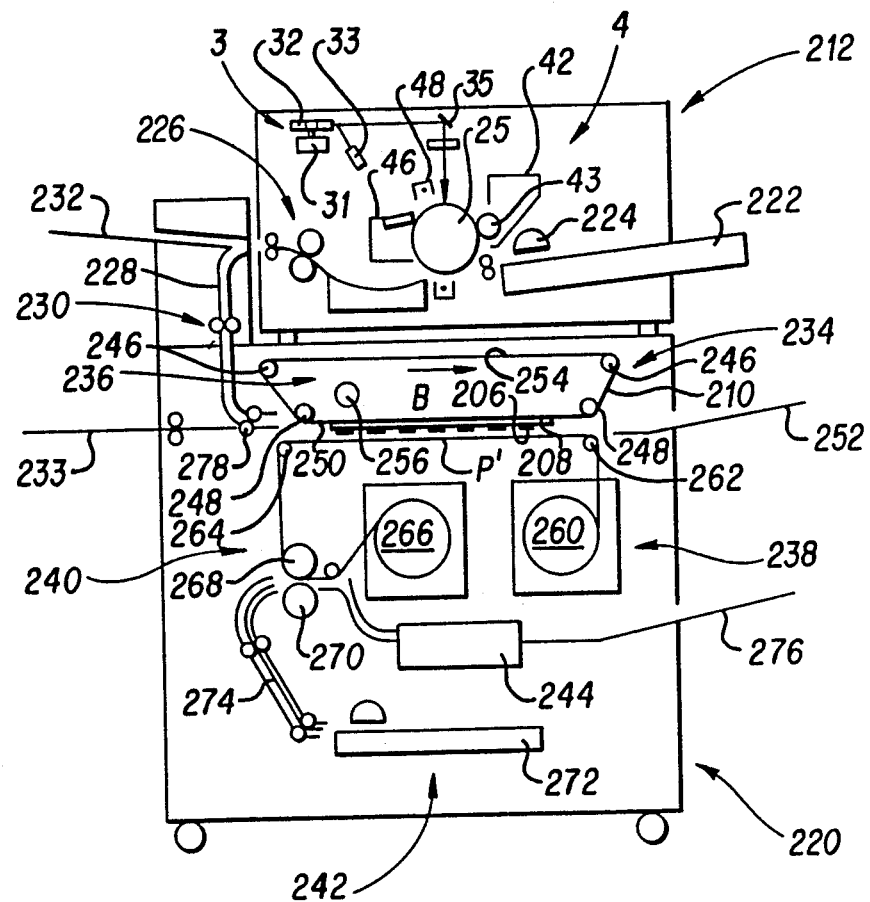

A third embodiment according to this invention will be described with reference to FIG. 7. In the third embodiment, a mask 206 is formed at a surface of a sheet 208 as a mask supporting member. The sheet 208 is carried by a movable belt 210 which serves as a filter.

The mask 206 is formed at the surface of the sheet 208 by a monochrome printer 212 mounted on a color printer 220. The monochrome printer 212 includes a laser scanner unit 3 and a xerography unit 4, etc. These units 3 and 4 are identical with those in the second embodiment.

The sheet 208 is made of a material having light transmittance and may be an ordinary paper or a transparent sheet. The sheets 208 are stacked on a sheet case 222. A single sheet 208 is supplied from the case 222 by means of a sheet feed roller 224. The sheet 208 is brought into surface contact with the photosensitive drum 25 to transfer a mask 206 from the drum to the sheet 208. The mask 206 is fixedly secured to the sheet 208 by fixing rollers 226 and the mask carrying sheet 208 is supplied to the color image recording apparatus 220 through a chute 228 and feed rollers 230. Incidentally, if the monochrome printer 212 is used for monochrome printing, the image carrying sheet 208 is discharged from a discharge tray 232. Further, a manual insertion tray 233 is provided to manually supply a mask carrying sheet 208 therefrom into the color image recording apparatus 220.

In the color image recording apparatus 220, there are provided a mask position adjusting unit 234, a light exposure unit 236, a photosensitive/pressure sensitive image recording medium supply unit 238, a developing unit 240, a developer sheet supply unit 242, a thermal fixing unit 244, etc. The movable belt 210 is positioned at an upper interior space of the color image recording apparatus 220 and constitutes the mask position adjusting unit 234. the movable belt 210 is made of light transmissive material such as polyethylene terephthalate similar to the movable film 156 of the second embodiment. The movable belt 210 is in the form of an endless belt and has a length slightly larger than the longitudinal lengths of three sheets 208. The belt 210 is mounted on drive rollers 246 and driven rollers 248. The two drive rollers 246 are positioned higher than the two driven rollers 248. A movable belt portion extending between the two driven rollers 248 defines a lower travel portion 250 and a movable belt portion extending between the two drive rollers 246 defines an upper travel portion 254. A length of the lower travel portion 250 is slightly larger than the longitudinal length of the single sheet 208. The lower travel portion 250 runs in a direction indicated by an arrow B in FIG. 7. The movable belt 210 is charged by a corotron or electrically conductive brush etc. (not shown) so as to attract the sheet 208 at the lower surface of the lower travel portion 250. After the light exposure, the sheet 208 is released from the movable belt 201 so that the sheet 208 is discharged into a sheet discharge tray 252.

A light source 256 is movably disposed at a space defined between the upper and lowerr travel portions 254 and 250. The light source 256 is movable by a drive means (not shown) and constitutes the light exposure unit 236. The light source 256 provides lights having broad wavelength bandwidth similar to the light source 51 of the second embodiment so as to irradiate the sheet 208 through the movable belt 210. A portion defined between the two driven rollers 248 is the light exposing position.

The photosensitive/pressure sensitive recording medium supply unit 238 is positioned below the mask position adjusting unit 234. The sensitive recording medium P' carries microcapsules C, M and Y which encapsulate chromogenic material which generates cyan, magenta and yellow colors. However, the recording medium P' does not carry a developer material contrary to the second embodiment. That is, in the third embodiment, a transfer type recording method is employed in which the developer material is coated on a "separate" substrate as a separate developer sheet as described in U.S. Pat. No. 4,399,209. The sensitive recording medium P' is wound around a supply reel 260 in a sheet roll arrangement. The sensitive recording medium P' drawn out of the supply reel 260 is introduced to a position immediately below the lower travel portion 250 by the guidance of guide rollers 262, 264. After the light exposure, the sensitive recording medium P' passes through the developer unit 240 and is wound around a take-up reel 266. The developer unit 240 includes a pair of pressure rollers 268, 270 where the sensitive recording medium P' is brought into pressure contact with a developer sheet 274 supplied from a developer sheet case 272 in the developer sheet supply unit 242. By the pressure contact, microcapsules carried on the sensitive recording medium P' are ruptured so that encapsulated chromogenic materials flow and react with the developer material of the developer sheet 274. At the downstream side of the developer unit 240, a thermal image fixing unit 244 is provided to heat the developer sheet 274 so that a glossy image is fixedly secured to the developer sheet. A developer sheet tray 276 is provided at the downstream side of the thermal image fixing unit 244 to receive a final output image thereon.

More specifically, the developer material is coated onto developer sheet 274 using a bonding agent such as polyvinyl alcohol. The developer material is reacted with a chromatic pigment (chromogenic material) contained in the microcapsules of the sensitive recording medium P'. Upon pressure, the microcapsules C, M and Y are ruptured so that the image is transferred to the developer sheet 274. Upon heating the developer sheet 274 at the thermal image fixing unit 244, the developer material and the polyvinyl alcohol are melted or softened, and as a result, a flat and glossy imaging surface is obtainable and the image is fixed.

In the third embodiment, the movable belt 210 is divided into three sections at equi-distance along longitudinal direction thereof and red, green and blue colors are provided, in order, in the sections. Three kinds of masks 206 formed at the monochrome printer 212 are supported on the sheet 208 and the masks 206 can be moved by the movement of the movable belt 210. That is, a sheet 208 carrying a cyan color group mask 206 is attracted to the red colored section of the movable belt 210, a sheet 208 carrying a magenta color group mask 206 is attracted to the green colored section of the movable belt 210, and a sheet 208 carrying a yellow color group mask 206 is attracted to the blue colored section of the movable belt 210. The mask carrying sheets 208 are movable and undergo positional adjustment at the exposure position by the controlled movement of the movable belt 210.

A position of a leading edge of the sheet 208 supplied through the chute 228 is adjusted by leading edge position adjusting rollers 278. Further, a lateral displacement adjusting means (not shown) is provided to adjust lateral position of the mask carrying sheet 208 with respect to the sensitive recording medium P'. Then the mask carrying sheet 208 is supplied into a space defined between the lower travel portion 250 of the movable belt 210 and the sensitive recording medium P' in synchronization with the movement of the movable belt 210. Similar to the second embodiment, the boundary marks and the sensor are used for detecting the position of the movable belt 210 which attracts the mask carrying sheet 208. At the mark detected position, the movable belt 210 is stopped.

According to the third embodiment, the movable belt 210 which is provided with three color zones functions as a filter so that only a specific light having a specific wavelength is transmitted through the movable belt 210, which is the specific light required for recording an image corresponding to the mask image. Accordingly, a color latent image is formed at the sensitive recording medium P' by the light exposure through the movable belt 210.

Instead of the movable belt 210 described above, the sheet 208 can be subjected to coloring. In the latter case, the sheet 208 functions as a filter. Further, another filter is used in addition to the movable belt and the sheet. The filter may be interposed between the movable belt and the sheet for the light exposure.

In view of the foregoing, according to the second and third embodiments of this invention, it is unnecessary to provide a plurality of light sources for generating different kinds of lights having wavelengths different from one another. Therefore, overall structure becomes compact and the apparatus is provided at low cost. For this, it is also unnecessary to provide a switching mechanism for selectively lighting one of the light sources. Further, in the second and third embodiments, it is unnecessary to provide independent filter members and means for driving therefore or a switching mechanism for selectively supplying one of the filters at the exposure station. Further, it is also unnecessary to finely control the position of the independent filter at the exposure position in addition to the fine positional controls of the sensitive recording medium and mask members because of the elimination of the independent filters.

Further, in the above-described embodiments, the masks are positive masks whose shapes are identical with the original image. However, the mask can be negative mask. In the latter case, the sheet carrying the negative mask, the movable film and the movable belt are adapted to allow specific light to pass therethrough for recording an image corresponding to an area other than the negative mask area.

Furthermore, in the above described embodiments, the movable film 156 and the movable belt 210 are subjected to coloring for serving as the filters. However, other techniques may be applied to allow specific light to transmit therethrough for recording the image corresponding to the mask image.

Furthermore, in the above-described embodiments, the photosensitive/pressure sensitive image recording medium P or P' carries photosensitive resin having a photo-curable characteristic. However, photo-softening type photosensitive resin may be employable in the sensitive recording medium. Moreover, a non-light reflective material is used as a mask material which is formed on a light reflective surface so as to light-expose the sensitive recording medium by the reflective lights.

While the invention has been described in detail and with reference to specific embodiments thereof, it will be apparent for those skilled in the art that various changes and modifications can be made therein without departing from the spirit and scope of the invention.

What is claimed is:

1. An image recording apparatus for recording an image on a recording medium, said recording medium including first and second recording mediums, said first recording medium having first and second surfaces and provided with a first material whose phase is changeable from a first to a second phase upon light exposure, and said second recording medium being provided with a second material reactable with said first material for forming a final output image thereon, comprising:

a mask forming means for forming light-shieldable masks on said first surface of said first recording medium;

a light exposure means confronting said first surface of said first recording medium for irradiating light toward said mask and said first surface; and, a pressure-developing means for providing said output image on said second recording medium, said second surface of said first recording medium carrying said first material, and said second material of said second recording medium contacting said second surface of said first recording medium at said pressure-developing means, wherein said first material comprises a photosensitive material and a chromogenic material selected from the colors comprising cyan, magenta and yellow, and said second material comprises a developer material, said photosensitive material and said chromogenic material being encapsulated in pressure rupturable microcapsules and mechanical strength of said microcapsules being different between said first phase and said second phase, and wherein said first recording medium comprises a light transmissive substrate having front and back surfaces, said light shieldable mask being positioned on said back surface of said substrate and said first material being carried on said front surface, said back surface being said first surface and said front surface being said second surface of said first recording medium.

* * * * *